(12) United States Patent  
Lee

(10) Patent No.: US 7,589,534 B2
(45) Date of Patent: Sep. 15, 2009

(54) METHOD AND APPARATUS FOR DETECTING CELL VOLTAGE OF BATTERY PACK

(75) Inventor: Jonathan Lee, Gunpo-si (KR)

(73) Assignee: LG Chem, Ltd. (KR)

( * ) Notice: Subject to any disclaimer, the term of this patent is extended or adjusted under 35 U.S.C. 154(b) by 304 days.

(21) Appl. No.: 11/442,873

(22) Filed: May 30, 2006

(65) Prior Publication Data

US 2006/0290355 A1    Dec. 28, 2006

(30) Foreign Application Priority Data

May 27, 2005    (KR) ...................... 10-2005-0044881

(51) Int. Cl.
*G01N 27/416*    (2006.01)
(52) U.S. Cl. ...................... 324/429; 324/430; 324/522; 324/691
(58) Field of Classification Search ................. 324/429, 324/430, 444, 522, 691, 713
See application file for complete search history.

(56) References Cited

U.S. PATENT DOCUMENTS

| | | | | |
|---|---|---|---|---|
| 5,721,688 A | * | 2/1998 | Bramwell | ..................... 702/63 |
| 5,767,661 A | * | 6/1998 | Williams | ..................... 320/152 |
| 7,009,401 B2 | * | 3/2006 | Kinoshita et al. | ........... 324/430 |
| 7,205,746 B2 | * | 4/2007 | Batson | ..................... 320/107 |
| 2003/0226836 A1 | * | 12/2003 | Miura et al. | ................ 219/204 |
| 2004/0111231 A1 | * | 6/2004 | Ando | ........................ 702/117 |

FOREIGN PATENT DOCUMENTS

JP    2004-235100    8/2004
WO    2005/054879    6/2005

* cited by examiner

*Primary Examiner*—Akm E Ullah
*Assistant Examiner*—Arun Williams
(74) *Attorney, Agent, or Firm*—Cantor Colburn LLP

(57) ABSTRACT

Disclosed is a method and apparatus for detecting a cell voltage of a battery pack. The method comprises the steps of storing an impedance of the conductive wire from a part connected to a voltage detector to a part connected with the corresponding battery cell existing between voltage measuring points of each battery cell, detecting current of the battery pack, multiplying the impedance of the conductive wire corresponding to each battery cell and the current to calculate a voltage correction value of each battery cell, detecting voltage of each battery cell, and correcting the voltage of each battery cell, with respect to the voltage correction value of each battery cell such that the voltage correction value corresponding to the voltage of each battery cell is subtracted during charging and the voltage correction value corresponding to the voltage of each battery cell is added during discharging.

4 Claims, 3 Drawing Sheets

METHOD AND APPARATUS FOR DETECTING CELL VOLTAGE OF BATTERY PACK

This application claims the benefit of the filing date of Korean Patent Application No. 2005-44881, filed on May 27, 2005, in the Korean Intellectual Property Office, the disclosure of which is incorporated herein in its entirety by reference.

BACKGROUND OF THE INVENTION

1. Field of the Invention

The present invention relates generally to a battery management system, and more particularly, to a method and apparatus for detecting voltage of a battery cell in consideration of impedance of conductive wires connecting a plurality of battery cells constituting the battery pack.

2. Description of the Prior Art

In general, voltage and current of a battery cell are separately detected in a battery management system. Lasting efforts are made to improve the precision of detecting the voltage and current of the battery cell.

Especially, technology of detecting the current of the battery cell is improved in precision by introducing an algorithm into the hardware, while technology of detecting the voltage of the battery cell is limited only to development of hardware technology.

In the battery management system, the most important factor is to calculate a state of charge (SOC) of the battery by means of accurate detection of the current. The SOC is compensated in the proximity of discharge end voltage. Because a time for this compensation is determined by reference voltage, the accurate voltage detection of the battery cell is essential to calculate the SOC of the battery.

A configuration of the conventional battery management system will be described with reference to FIG. 1.

Referring to FIG. 1, the conventional battery management system comprises a battery pack connecting a plurality of battery cells C1, C2 and C3 in series or in parallel, a voltage detector 101 detecting the voltage of the battery cells C1, C2 and C3 constituting the battery pack, a resistor 102 detecting charge/discharge current flowing through the battery pack, a current detector 103 detecting current across the resistor 102, a controller 104 summing up and controlling the voltage and current detected through the voltage and current detectors 101 and 103, and a communication unit 105 taking charge of communication between the controller 104 and external equipment. The voltage detector 101, the current detector 103, the controller 103, and the communication unit 105 are included in a fuel gauging integrated circuit (IC) formed into one chip.

The battery pack connected in series by the plurality of battery cells has a cathode (+) connected with a plus terminal B+ of power output terminals, and an anode (−) connected with a minus terminal B−. Further, the cathode (+) and anode (−) of the battery pack and two contacts between the plurality of battery cells C1, C2 and C3 constituting the battery pack are connected to the voltage detector 101.

The voltage detector 101 is connected to each of the contacts between the plurality of battery cells C1, C2 and C3 connected in series, and detects voltage between the respective contacts without considering impedance of conductive wires connecting the battery cells. Hence, the voltage measured by the voltage detector 101 includes an error corresponding to a drop/rise value of voltage caused by the impedance of the conductive wires.

In this manner, conventionally, the voltage is detected without taking into consideration the impedance of the conductive wires connecting the battery cells, so that there is no alternative but to include the error caused by the impedance of the conductive wires.

This error lowers precision of calculating the actual SOC of the battery, which is responsible for short duration of the battery pack or abnormal protection.

Further, the error increases as the current flowing in the battery pack becomes higher.

SUMMARY OF THE INVENTION

Accordingly, the present invention has been made to solve these various problems occurring in the prior art, and an objective of the present invention is to provide a method and apparatus of detecting voltage of a battery cell in consideration of impedance of conductive wires connecting a plurality of battery cells constituting the battery pack In order to accomplish this objective, according to an aspect of the present invention, there is provided a method of detecting voltage of at least one battery cell in a battery pack, in which the battery cell is connected through a conductive wire. The method comprises the steps of: storing impedance of the conductive wire from a part connected to a voltage detector to a part connected with the corresponding battery cell; detecting current of the battery pack; multiplying the impedance of the conductive wire corresponding to each battery cell and the current to calculate a correction value of each battery cell; detecting voltage of each battery cell; and correcting the voltage of each battery cell on the basis of the correction value of each battery cell.

According to another aspect of the present invention, there is provided an apparatus of detecting voltage of at least one battery cell in a battery pack, in which the battery cell is connected through a conductive wire. The apparatus comprises: a voltage detector detecting the voltage of each battery cell; a memory storing impedance of the conductive wire from a part connected to a voltage detector to a part connected with the corresponding battery cell; a current detector detecting current of the battery pack; and a controller multiplying the impedance of the conductive wire corresponding to each battery cell and the current to calculate a correction value of each battery cell, and correcting the voltage of each battery cell on the basis of the correction value of each battery cell.

DETAILED DESCRIPTION OF THE PREFERRED EMBODIMENTS

Hereinafter, exemplary embodiments of the present invention will be described in detail with reference to the accompanying drawings.

Figure 1:
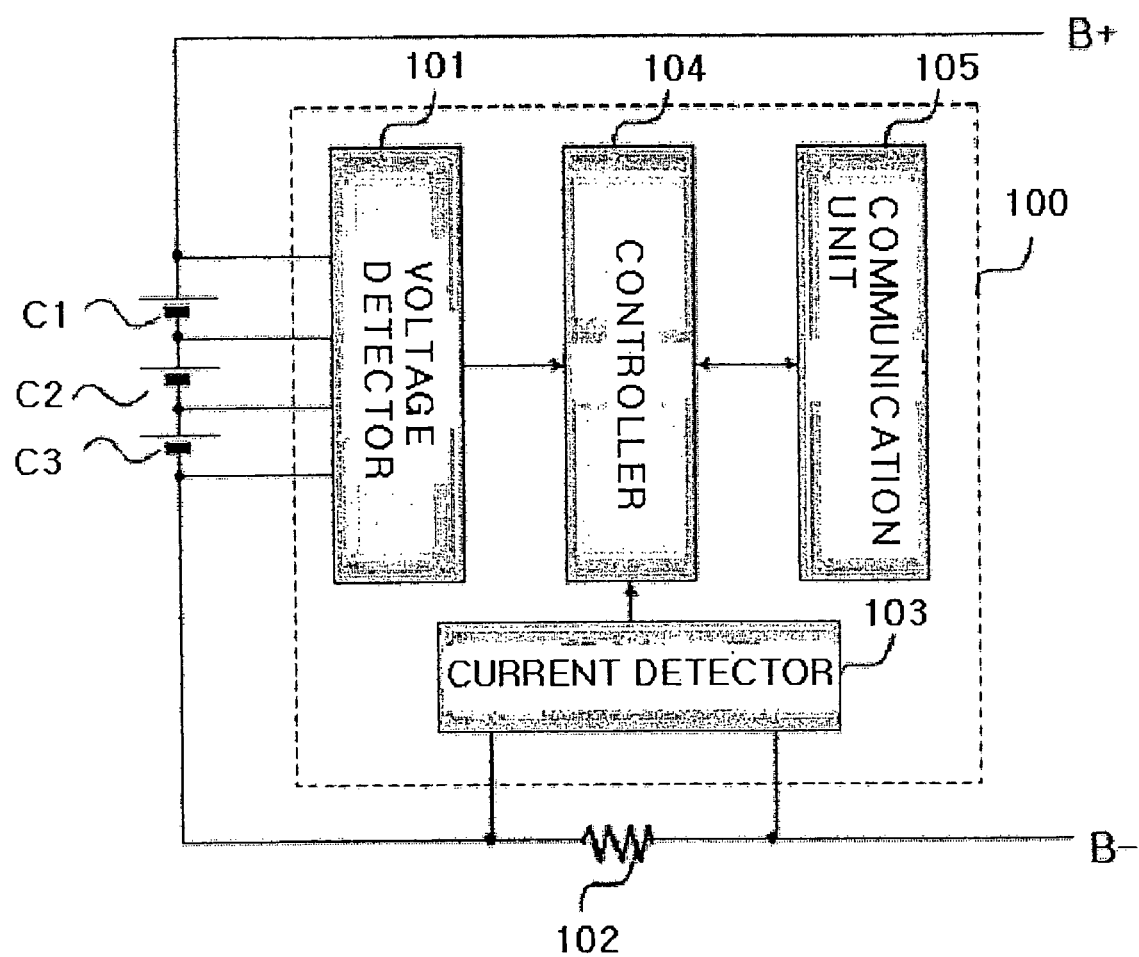
FIG. 1 illustrates a configuration of a conventional battery management system.
Figure 2:
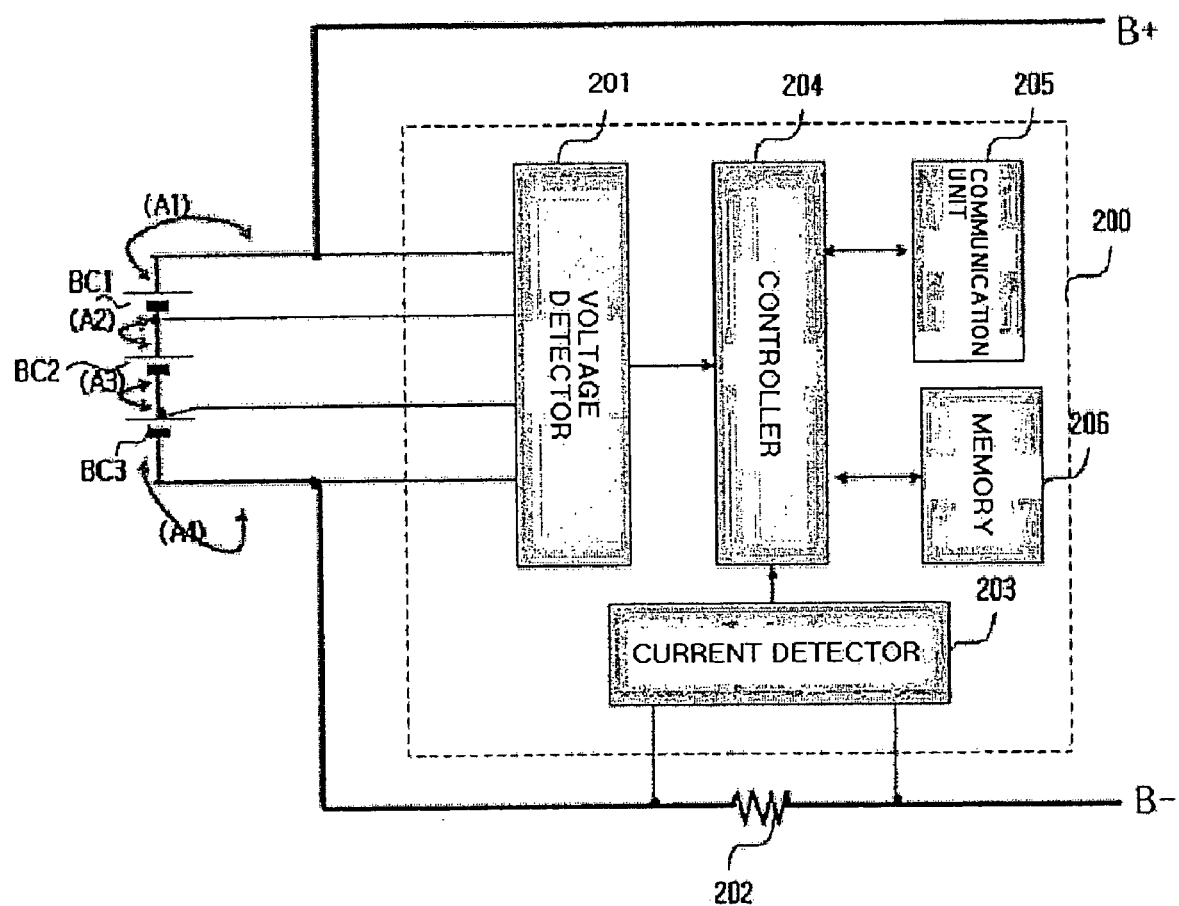
FIG. 2 illustrates a configuration of a battery management system according to an exemplary embodiment of the present invention.

FIG. 2 illustrates a configuration of a battery management system according to an exemplary embodiment of the present invention.

The battery management system 200 is provided with a battery pack, which is composed of first, second, and third battery cells BC1, BC2, and BC3. The first to third battery cells BC1 to BC3 are connected in series through first to fourth conductive wires A1 to A4. Further, main current of the battery pack flows through the first to third battery cells BC1 to BC3, and the first to fourth conductive wires A1 to A4.

The first conductive wire A1 is connected with a cathode (+) of the first battery cell BC1 and a first terminal of a voltage detector 201. The first terminal and the first conducive wire A1 are connected through a first lead. Because the main current of the battery pack does not flow to the first lead, it is not necessary to consider impedance of the first lead.

The second conductive wire A2 is connected between an anode (−) of the first battery cell BC1 and a cathode (+) of the second battery cell BC2. A tap between the second conductive wire A2 and the anode (−) of the first battery cell BC1 is connected with a second terminal of the voltage detector 201 through a second lead. Because the main current of the battery pack does not flow to the second lead, it is not necessary to consider impedance of the second lead.

The third conductive wire A3 is connected between an anode (−) of the second battery cell BC2 and a cathode (+) of the third battery cell BC3. A tap between the third conductive wire A3 and the cathode (+) of the third battery cell BC3 is connected with a third terminal of the voltage detector 201 through a third lead. Because the main current of the battery pack does not flow to the third lead, it is not necessary to consider impedance of the third lead.

The fourth conductive wire A4 is connected with an anode (−) of the third battery cell BC3 and a fourth terminal of the voltage detector 201. The fourth terminal and the fourth conducive wire A4 are connected through a fourth lead. Because the main current of the battery pack does not flow to the fourth lead, it is not necessary to consider impedance of the fourth lead.

With respect to the first battery cell BC1, the voltage detector 201 measures voltage between an end terminal of the first conductive wire A1 and the anode of the first battery cell BC1. In this case, the voltage of the first battery cell BC1 should take into consideration a voltage drop or rise caused by the impedance of the first conductive wire A1.

With respect to the second battery cell BC2, the voltage detector 201 measures voltage between the anode of the first battery cell BC1 and the cathode of the third cell BC3. In this case, the voltage of the second battery cell BC2 should take into consideration a voltage drop or rise caused by the impedance of the second and third conductive wires A2 and A3.

Finally, with respect to the third battery cell BC3, the voltage detector 201 measures voltage between the cathode of the third battery cell BC3 and an end terminal of the fourth conductive wire A4. In this case, the voltage of the third battery cell BC3 should take into consideration a voltage drop or rise caused by the impedance of the fourth conductive wire A4.

In this manner, the voltage detector 201 detects the voltage of each of the first to third battery cells BC1 to BC3, and provides the detected results to a controller 204.

A current detector 203 detects current flowing through a current detection resistor 202, and provides the detected result to the controller 204.

The controller 204 creates various pieces of information for controlling the battery pack on the basis of the voltage and current measurement values of the battery cells which are measured through the voltage and current detectors 201 and 203. Particularly, according to an exemplary embodiment of the present invention, the controller 204 corrects the voltage measurement values of the battery cells using impedance measurement values of the conductive wires corresponding to the first to third battery cells BC1 to BC3, wherein the impedance measurement values are stored in a memory 206.

A communication unit 205 takes charge of communication between the controller 204 and external equipment. Particularly, the communication unit 205 receives the impedance measurement values of the conductive wires corresponding to the first to third battery cells BC1 to BC3, and provides the received results to the controller 204.

The memory 206 stores various pieces of information including processing programs of the controller 204. Particularly, according to an exemplary embodiment of the present invention, the memory 206 stores the impedance measurement values of the conductive wires corresponding to the first to third battery cells BC1 to BC3 as shown in Table 1.

TABLE 1

| Conductive Wire | Impedance |
| --- | --- |
| Conductive wire A1 corresponding to first battery cell BC1 | First impedance Impedance_Voltage_B1 |
| Conductive wires A2 and A3 corresponding to second battery cell BC2 | Second impedance Impedance_Voltage_B2 |
| Conductive wire A4 corresponding to third battery cell BC3 | Third impedance Impedance_Voltage_B3 |

In Table 1, the first impedance Impedance_Voltage_B1 is the impedance of the first conductive wire A1, the second impedance Impedance_Voltage_B2 is the sum of the impedance of the second conductive wire A2 and the impedance of the third conductive wire A3, and the third impedance Impedance_Voltage_B3 is the impedance of the fourth conductive wire A4.

Here, the first, second, and third impedances Impedance_Voltage_B1, Impedance_Voltage_B2, and Impedance_Voltage_B3, which correspond to the first, second, and third battery cells BC1, BC2, and BC3 respectively, are measured through a milliohm meter (not shown), and provided to the controller 204 through the communication unit 205. The controller 204 instructs the memory 206 to store the impedances.

Further, the voltage detector 201, the current detector 203, the controller 204, the communication unit 205, and the memory 206 can be included in a fuel gauging integrated circuit (IC) formed into one chip.

Figure 3:
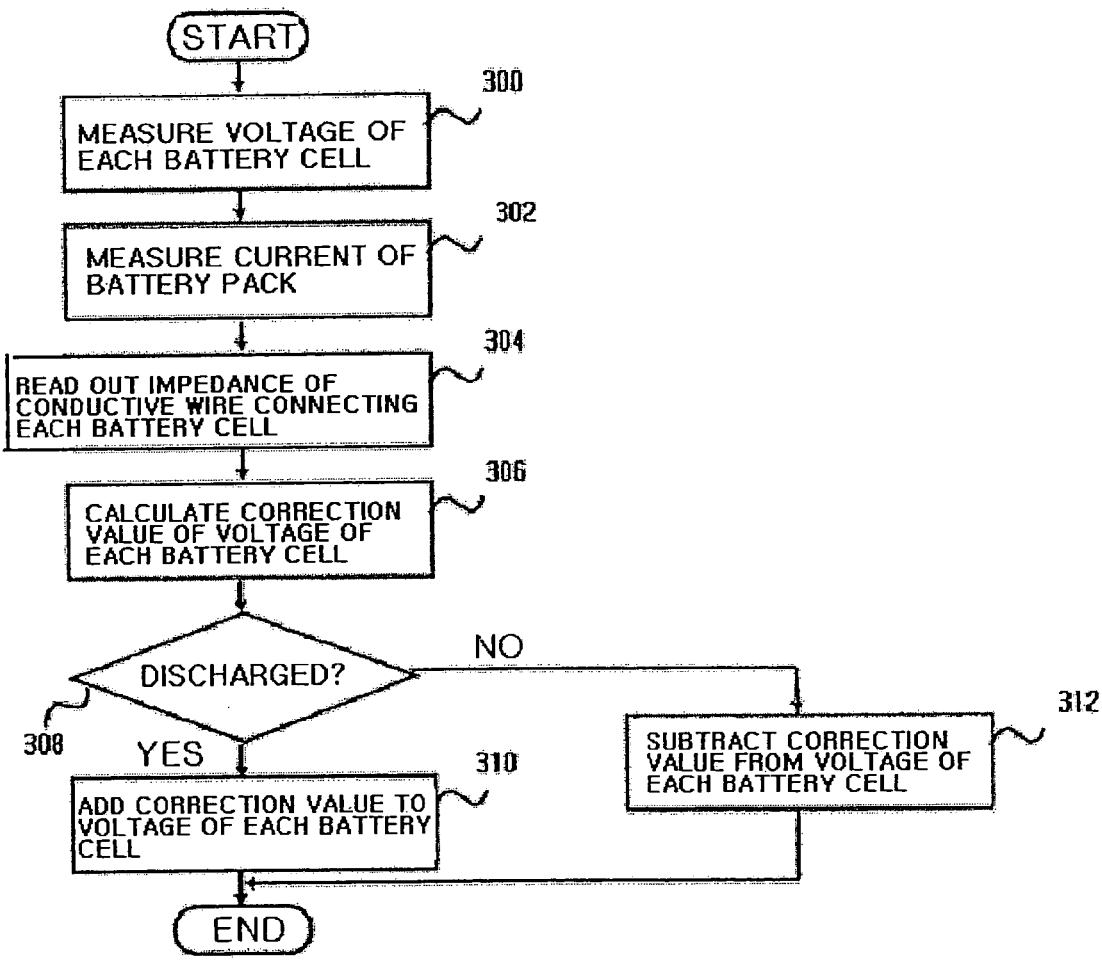
FIG. 3 is a flowchart illustrating a method of detecting voltage of each battery cell in a battery pack, according to an exemplary embodiment of the present invention.

Now, a method of detecting a voltage of a battery cell, which can be applied to the battery management system, will be described with reference to a flowchart of FIG. 3.

The controller 204 measures voltage of each of the first, second, and third battery cells BC1, BC2, and BC3 constituting the battery pack through the voltage detector 201. Each measured voltage is as shown in Table 2, and temporarily stored in the memory 206 (S300).

TABLE 2

| Voltage of Battery Cell | Measured Voltage Variable |
| --- | --- |
| Voltage of first battery cell BC1 | Real_Voltage_B1 |
| Voltage of second battery cell BC2 | Real_Voltage_B2 |
| Voltage of third battery cell BC3 | Real_Voltage_B3 |

Thereafter, the controller 204 measures current of the battery pack through the current detector 203 (S302), and reads out the first, second, and third impedances Impedance_Voltage_B1, Impedance_Voltage_B2, and Impedance_Voltage_B3, which correspond to the first, second, and third battery cells BC1, BC2, and BC3 respectively, and are stored in the memory 206 in advance (S304).

Then, the controller 204 multiplies the first, second, and third impedances Impedance_Voltage_B1, Impedance_Voltage_B2, and Impedance_Voltage_B3, which correspond to the first, second, and third battery cells BC1, BC2, and BC3 and are stored in the memory 206, by the current value detected through the current detector 203, thereby creating a correction value of each of the first, second, and third battery cell BC1, BC2, and BC3. Here, the correction values are created by Equation First Impedance (Impedance_Voltage_B1)× Current=Correction Value of First Battery Cell (BC1);

Second Impedance (Impedance_Voltage_B2)× Current=Correction Value of Second Battery Cell (BC2); and Third Impedance (Impedance_Voltage_B3)× Current=Correction Value of Third Battery Cell (BC3)  Equation 1

When the creation of the correction values based on Equation 1 is completed, the controller 204 checks whether the battery pack is in a charged state or in a discharged state on the basis of the current value detected through the current detector 203 (S308).

As a result of the checking on the basis of the current value, if the battery pack is in a discharged state, the controller 204 adds the calculated correction value of each of the first, second, and third battery cells BC1, BC2, and BC3 to the measured voltage of each of the first, second, and third battery cells BC1, BC2, and BC3, thereby calculating final voltage of each of the first, second, and third battery cells BC1, BC2, and BC3. Here, the final voltage of each of the battery cells is obtained by Equation 2.

Measured Voltage (Real_Voltage_B1) of First Battery Cell BC1+Correction Value of First Battery Cell BC1=Final Voltage (Correction_Voltage_B1) of First Battery Cell BC1;

Measured Voltage (Real_Voltage_B2) of Second Battery Cell BC2+Correction Value of Second Battery Cell BC2=Final Voltage (Correction_Voltage_B2) of Second Battery Cell BC2; and Measured Voltage (Real_Voltage_B3) of Third Battery Cell BC3+Correction Value of Third Battery Cell BC3=Final Voltage (Correction_Voltage_B3) of Third Battery Cell BC3  Equation 2

As a result of the checking on the basis of the current value in step S308, if the battery pack is in the charged state, the controller 204 subtracts the calculated correction value of each of the first, second, and third battery cells BC1, BC2, and BC3 from the measured voltage of each of the first, second, and third battery cells BC1, BC2, and BC3, thereby calculating final voltage of each of the first, second, and third battery cells BC1, BC2, and BC3, Here, the final voltage of each of the battery cells when charged is obtained by Equation 3.

Measured Voltage (Real_Voltage_B1) of First Battery Cell BC1−Correction Value of First Battery Cell BC1=Final Voltage (Correction_Voltage_B1) of First Battery Cell BC1;

Measured Voltage (Real_Voltage_B2) of Second Battery Cell BC2−Correction Value of Second Battery Cell BC2=Final Voltage (Correction_Voltage_B2) of Second Battery Cell BC2; and Measured Voltage (Real_Voltage_B3) of Third Battery Cell BC3−Correction Value of Third Battery Cell BC3=Final Voltage (Correction_Voltage_B3) of Third Battery Cell BC3  Equation 3

As described above, the voltage of each battery cell is corrected in consideration of the voltage drop or rise caused by the impedance of each of the conductive wires connecting the battery cells. Thereby, it is possible to accurately measure the voltage of each battery cell.

The embodiment of the present invention comprises computer readable media including program commands for executing operation implemented by various computers. The computer readable media may include a program command, a data file, a data structure, etc. in individual or combination. The program command of the media may be one designed or constructed especially for the present invention or an available one well-known to those skilled in the computer software field.

INDUSTRIAL APPLICABILITY

As can be seen from the foregoing, the voltage of each battery cell is detected in consideration of the impedance of each of the conductive wires connecting the plurality of battery cells constituting the battery pack. As a result, when various pieces of information for battery management, such as a measurement of the SOC of the battery, are estimated, the estimated reliability can be improved.

Although exemplary embodiments of the present invention has been described for illustrative purposes, those skilled in the art will appreciate that various modifications, additions and substitutions are possible, without departing from the scope and spirit of the invention as disclosed in the accompanying claims.

What is claimed is:

1. method for detecting each voltage of multiple battery cells in a battery pack, in which each battery cell is connected through a conductive wire, the method comprising:

storing an impedance existing between voltage measuring points of each battery cell;

detecting a current of the battery pack;

multiplying the impedance of the conductive wire corresponding to each battery cell and the current to calculate a correction value of each battery cell;

detecting a voltage of each battery cell; and correcting the voltage of each battery cell with respect to the correction value of each battery cell such that the voltage correction value corresponding to the voltage of each battery cell is subtracted during charging and the voltage correction value corresponding to the voltage of each battery cell is added during discharging.

2. The method as claimed in claim 1, wherein the charged or discharged state of each battery cell is detected based on the detected current.

3. An apparatus for detecting each voltage of multiple battery cells in a battery pack, in which each battery cell is connected through a conductive wire, the apparatus comprising:

a voltage detector which detects the voltage of each battery cell;

a memory which stores an impedance existing between voltage measuring points of each battery cell;

a current detector which detects current of the battery pack; and a controller which multiplies the impedance of the conductive wire corresponding to each battery cell and the current to calculate a voltage correction value of each battery cell, and corrects the voltage of each battery cell with respect to the correction value of each battery cell so as to subtract the voltage correction value corresponding to the voltage of each battery cell during charging and to add the voltage correction value corresponding to the voltage of each battery cell during discharging.

4. The apparatus as claimed in claim 3, wherein the charged or discharged state of each battery cell is detected based on the detected current of the battery pack.

* * * * *